US009824789B2

(12) United States Patent
Pei et al.

(10) Patent No.: US 9,824,789 B2
(45) Date of Patent: Nov. 21, 2017

(54) METHOD FOR PRODUCING NANOWIRE-POLYMER COMPOSITE ELECTRODES

(71) Applicant: THE REGENTS OF THE UNIVERSITY OF CALIFORNIA, Oakland, CA (US)

(72) Inventors: Qibing Pei, Calabasas, CA (US); Zhibin Yu, Los Angeles, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 13/783,284

(22) Filed: Mar. 2, 2013

(65) Prior Publication Data
US 2013/0251943 A1  Sep. 26, 2013

Related U.S. Application Data

(63) Continuation of application No. PCT/US2011/053107, filed on Sep. 23, 2011.
(Continued)

(51) Int. Cl.
*H01B 1/22* (2006.01)
*H01B 1/02* (2006.01)
(Continued)

(52) U.S. Cl.
CPC ............ *H01B 1/22* (2013.01); *B29C 41/003* (2013.01); *B29D 11/0074* (2013.01);
(Continued)

(58) Field of Classification Search
None
See application file for complete search history.

(56) References Cited

U.S. PATENT DOCUMENTS 7,170,481 B2 * 1/2007 Doane et al. .............. 345/87
8,957,315 B2    2/2015 Philip, Jr. et al.
(Continued)

FOREIGN PATENT DOCUMENTS

JP   2006-171336 A   6/2006
JP   2012-009240 A   1/2012
(Continued)

OTHER PUBLICATIONS

Korean Intellectual Property Office, International Search Report and Written Opinion dated Oct. 18, 2013 for related International Patent Application No. PCT/US2013/051349 (International Publication No. WO 2012/040637) (pp. 1-13), with claims searched (pp. 13-17) pp. 1-17.
(Continued)

*Primary Examiner* — Edmund Lee
(74) *Attorney, Agent, or Firm* — Gates & Cooper LLP

(57) ABSTRACT

A method for producing flexible, nanoparticle-polymer composite electrodes is described. Conductive nanoparticles, preferably metal nanowires or nanotubes, are deposited on a smooth surface of a platform to produce a porous conductive layer. A second application of conductive nanoparticles or a mixture of nanoparticles can also be deposited to form a porous conductive layer. The conductive layer is then coated with at least one coating of monomers that is polymerized to form a conductive layer-polymer composite film. Optionally, a protective coating can be applied to the top of the composite film. In one embodiment, the monomer coating includes light transducing particles to reduce the total internal reflection of light through the composite film or pigments that absorb light at one wavelength and re-emit light at a longer wavelength. The resulting composite film has an active side that is smooth with surface height variations of 100 nm or less.

34 Claims, 9 Drawing Sheets

Related U.S. Application Data

(60) Provisional application No. 61/386,454, filed on Sep. 24, 2010.

(51) Int. Cl.

| | | |
|---|---|---|
| *H01L 51/00* | (2006.01) | |
| *B29C 41/00* | (2006.01) | |
| *B29D 11/00* | (2006.01) | |
| *G06F 3/041* | (2006.01) | |
| *H01L 51/50* | (2006.01) | |
| *H01L 51/52* | (2006.01) | |

(52) U.S. Cl.
CPC .............. *G06F 3/041* (2013.01); *H01B 1/02* (2013.01); *H01L 51/003* (2013.01); *H01L 51/0021* (2013.01); *G06F 2203/04103* (2013.01); *H01L 51/5036* (2013.01); *H01L 51/5206* (2013.01); *H01L 51/5268* (2013.01); *H01L 2227/326* (2013.01); *H01L 2251/5338* (2013.01); *H01L 2251/5369* (2013.01); *Y10T 428/24355* (2015.01)

(56) References Cited

U.S. PATENT DOCUMENTS

| 8,957,318 | B2 | 2/2015 | Zou et al. | |
|---|---|---|---|---|
| 2004/0099438 | A1* | 5/2004 | Arthur | B82Y 10/00 174/257 |
| 2008/0143906 | A1 | 6/2008 | Allemand et al. | |
| 2008/0259262 | A1* | 10/2008 | Jones | B82Y 10/00 349/139 |
| 2009/0321113 | A1 | 12/2009 | Allemand et al. | |
| 2010/0028656 | A1* | 2/2010 | Kim et al. | 428/323 |
| 2010/0075447 | A1 | 3/2010 | Lee et al. | |
| 2010/0102281 | A1* | 4/2010 | Hisashi | B82Y 30/00 252/511 |
| 2010/0307589 | A1 | 12/2010 | Choi et al. | |
| 2011/0156577 | A1 | 6/2011 | Koyama et al. | |
| 2011/0281070 | A1 | 11/2011 | Mittal et al. | |
| 2011/0285019 | A1 | 11/2011 | Alden et al. | |
| 2012/0098419 | A1 | 4/2012 | Chiba et al. | |
| 2012/0104374 | A1 | 5/2012 | Allemand | |
| 2013/0000952 | A1 | 1/2013 | Srinivas et al. | |
| 2013/0089735 | A1 | 4/2013 | Kim et al. | |
| 2013/0206227 | A1 | 8/2013 | Shimizu et al. | |
| 2013/0341074 | A1 | 12/2013 | Virkar et al. | |
| 2013/0342221 | A1 | 12/2013 | Virkar et al. | |
| 2014/0004371 | A1 | 1/2014 | Chung et al. | |
| 2014/0072826 | A1 | 3/2014 | Philip, Jr. et al. | |
| 2014/0170407 | A1 | 6/2014 | Zou et al. | |
| 2014/0170427 | A1 | 6/2014 | Philip, Jr. et al. | |
| 2014/0199555 | A1 | 7/2014 | Philip, Jr. et al. | |
| 2014/0202738 | A1 | 7/2014 | Allemand et al. | |
| 2014/0205845 | A1 | 7/2014 | Philip, Jr. et al. | |
| 2014/0231718 | A1 | 8/2014 | Lin et al. | |
| 2014/0235123 | A1 | 8/2014 | Lin et al. | |
| 2014/0313562 | A1 | 10/2014 | Ruoff et al. | |
| 2015/0008016 | A1 | 1/2015 | Poon | |
| 2015/0014022 | A1 | 1/2015 | Young et al. | |
| 2015/0037517 | A1 | 2/2015 | Buriak et al. | |
| 2015/0137110 | A1 | 5/2015 | Ahn et al. | |
| 2015/0250078 | A1 | 9/2015 | Matsuda et al. | |
| 2015/0262724 | A1 | 9/2015 | Naito et al. | |
| 2016/0114395 | A1 | 4/2016 | Kim et al. | |
| 2016/0195948 | A1 | 7/2016 | Tomohisa et al. | |
| 2016/0196894 | A1 | 7/2016 | Matsuda et al. | |
| 2016/0224140 | A1 | 8/2016 | Matsuda et al. | |

FOREIGN PATENT DOCUMENTS

| KR | 10-2005-0121935 A | 12/2005 |
|---|---|---|
| KR | 10-2009-0060344 A | 6/2009 |
| KR | 10-2010-001696 A | 2/2010 |
| WO | 2007/004758 A1 | 1/2007 |
| WO | 2007/022226 A2 | 2/2007 |
| WO | 2008-131304 A1 | 10/2008 |
| WO | 2010/010838 A1 | 1/2010 |
| WO | 2012015524 | 2/2012 |
| WO | 2012/040637 A2 | 3/2012 |
| WO | 20121040637 A2 | 3/2012 |
| WO | 2014169487 | 10/2014 |

OTHER PUBLICATIONS

Korean Intellectual Property Office, International Search Report and Written Opinion dated Oct. 18, 2013 for related International Patent Application No. PCT/US2011/053107 (International Publication No. WO 2012/040637) (pp. 1-13), with claims searched (pp. 13-17) pp. 1-17.

Hu et al., "Scalable Coating and Properties of Transparent, Flexible, Silver Nanowire Electrodes", Acs Nano, Apr. 28, 2010, 4 (5), pp. 2955-2963.

Zeng et al. "A new transparent conductor: silver nanowire film buried at the surface of a transparent polymer," Advanced Materials, Aug. 3, 2010, pp. 4484-4488.

Korean Intellectual Property Office, International Search Report and Written Opinion (pp. 1-8) , dated Apr. 13, 2012 for corresponding International Patent Application No. PCT/US2011/053107, with claims searched (pp. 9-13) pp. 1-13.

European Patent Office, European Supplemental Search Report, dated May 9, 2014 in corresponding European Patent Application No. 11827658.3 (International Patent Application No. PCT/US2011053107) (pp. 1-7) with pending claims (pp. 8-9) pp. 1-9.

The Patent Office of the People's Republic of China, The First Office Action, CN application No. 201180044909.1, dated Dec. 29, 2014 (pp. 1-13), with claims examined (pp. 14-19), counterpart to U.S. Appl. No. 13/783,284 herein.

The State Intellectual Property Office of the People's Republic of China, Notification of 2nd Office Action, issued Jul. 20, 2015 (pp. 1-13), with claims examined (pp. 14-19), counterpart to U.S. Appl. No. 13/783,284.

Day, T. M., et al., "Electrochemical Templating of Metal Nanoparticales and Nanowires on Single-Walled Carbon Nanotube Networks", J. Am. Chem. Soc., vol. 127, pp. 10639-10647, 2005.

Chen, P. C., et al., "Preparation and Characterization of Flexible Asymmetric Supercapacitors Based on Transition-Metal-Oxide Nanowire/Single-Walled Carbon Nanotube Hybrid Thin-Film Electrodes", Am. Chem. Soc., ACS Nano, vol. 4, No. 8, pp. 4403-4411, 2010.

Gao, C., et al., "Facile and large-scale synthesis and characterization of carbon nanotube/silver nanocrystal nanohybrids", Nanotechnology, vol. 17, pp. 2882-2890, 2006.

Govindaraj, A., et al., "Metal Nanowires and Intercalated Metal Layers in Single-Walled Carbon Nanotube Bundles", Chem. Mater., vol. 12, pp. 202-205, 2000.

Lee, J. Y., et al., "Solution-Processed Metal Nanowire Mesh Transparent Electrodes", Nano Letters, vol. 8, No. 2, pp. 389-692, 2007.

Sun, S., et al., "Synthesis and Characterization of Platinum Nanowire-Carbon Nanotube Heterostructures", Chem. Mater., vol. 19, pp. 6376-6378, 2007.

Chinese Office Action (with English translation) dated Dec. 8, 2015 for Chinese Patent Application No. 201180044909.1.

CN Allowed claims, CN Patent No. CN102843906B, granted Jul. 20, 2016.

Jia, Y., et al., "Silver Nanowire Transparent Conductive Films with High Uniformity Fabricated via a Dynamic Heating Method", ACS Appl. Mater. Interfaces 2016, vol. 8, pp. 9865-9871.

Kim, T., et al., "Highly Transparent Au-Coated Ag Nanowire Transparent Electrode", ACS Appl. Mater. Interfaces 2014, vol. 6, pp. 13527-13534.

Zhang, W., et al., "Bridging Oriented Copper Nanowire-Graphene Composites for Solution-Processable, Annealing-Free, and Air-Stable Flexible Electrodes", ACS Appl. Mater. Interfaces 2016, vol. 8, pp. 1733-1741.

* cited by examiner

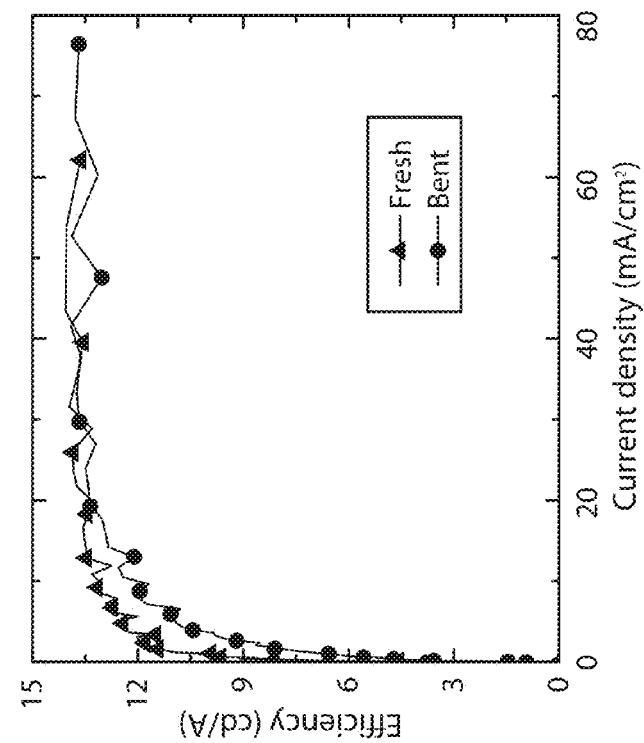
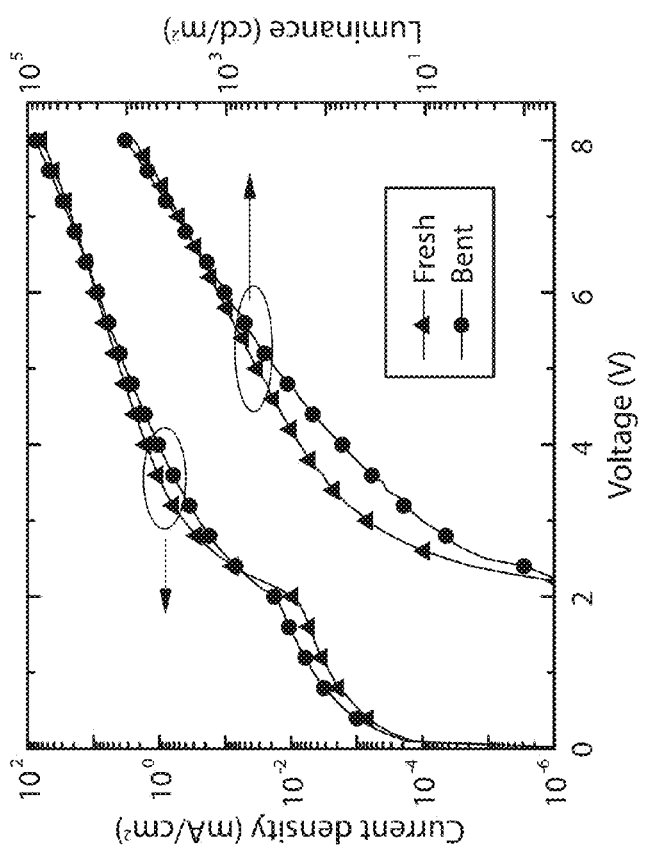
FIG. 6B
FIG. 6A

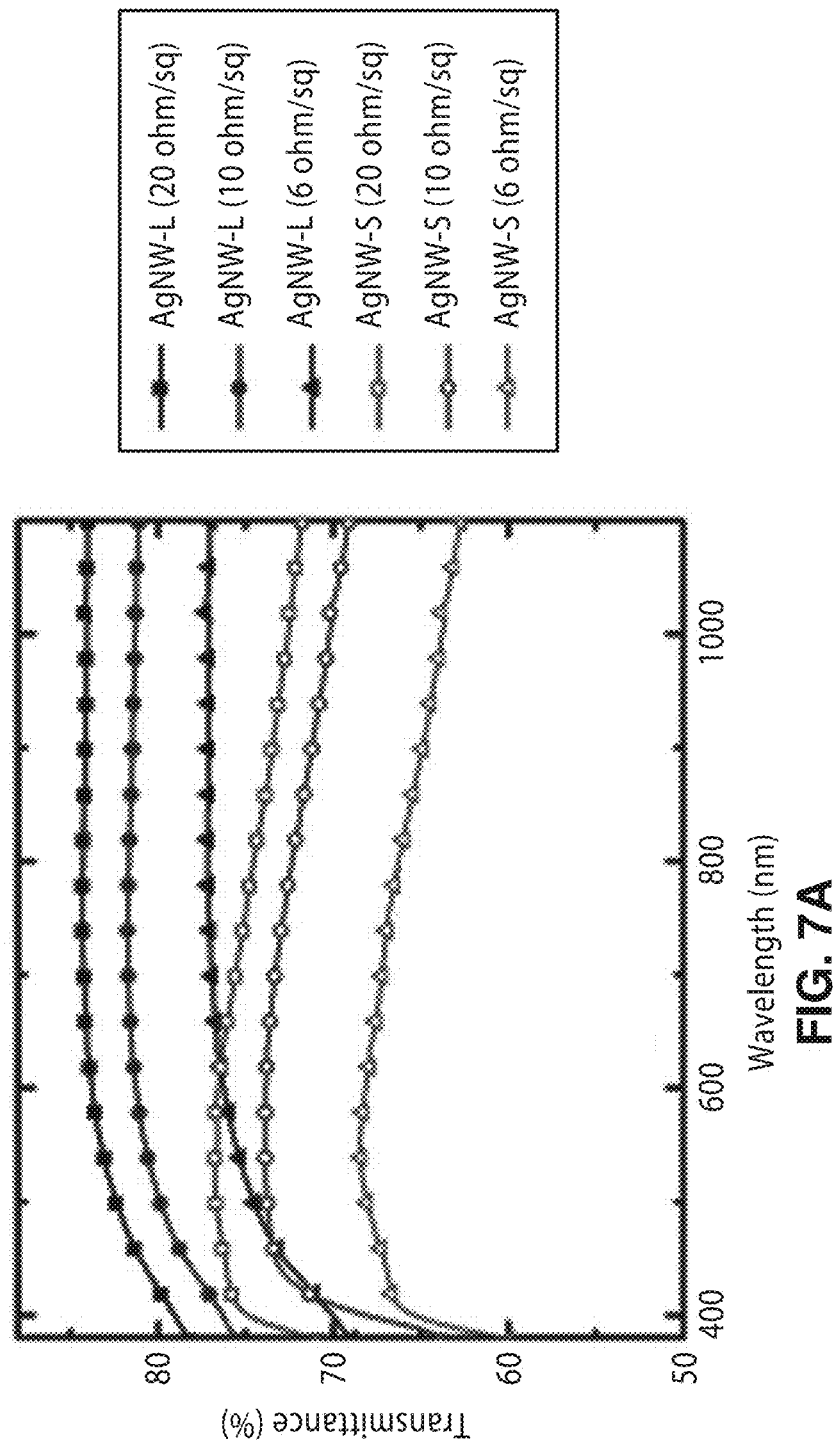

METHOD FOR PRODUCING NANOWIRE-POLYMER COMPOSITE ELECTRODES

CROSS-REFERENCE TO RELATED APPLICATIONS

This application is a 35 U.S.C. §111(a) continuation of PCT international application number PCT/US2011/053107 filed on Sep. 23, 2011, incorporated herein by reference in its entirety, which is a nonprovisional of U.S. provisional patent application Ser. No. 61/386,454 filed on Sep. 24, 2010, incorporated herein by reference in its entirety. Priority is claimed to each of the foregoing applications.

The above-referenced PCT international application was published as PCT International Publication No. WO 2012/040637 on Mar. 29, 2012 and republished on May 31, 2012, and said publications are incorporated herein by reference in their entirety.

STATEMENT REGARDING FEDERALLY SPONSORED RESEARCH OR DEVELOPMENT

This invention was made with Government support under Grant No. DE-FC26-08NT01575, awarded by the United States Department of Energy. The Government has certain rights in this invention.

INCORPORATION-BY-REFERENCE OF MATERIAL SUBMITTED ON A COMPACT DISC

Not Applicable

BACKGROUND OF THE INVENTION

1. Field of the Invention

This invention pertains generally to fabrication methods and applications of nanowire-polymer composite electrodes, and more particularly to methods for fabricating flexible, transparent conductors utilizing conductive nanowires with a smooth active surface for use in electronic devices such as light emitting devices and solar cells.

2. Description of Related Art

Organic electronic devices such as organic light emitting diodes (OLEDs) and flexible OLEDs have advanced tremendously in recent years. These devices can be fabricated on to large areas and substrates and are compatible with low-cost fabrication processes. Such flexible and deformable electronic devices are needed for many new applications such as wearable displays, solar panels, touch screens, electro-chromic devices and non-invasive biomedical devices, where large deformations may be required to cope with body movements. Deformable devices could also enable conformation onto irregular mounting surfaces.

Electrodes for such electro-optical devices normally must be transparent and flexible. Such flexible electrodes require high transparency and conductivity, strong adhesion, flexibility of the conductive layer with respect to the substrate as well as a smooth conductive layer surface. High conductivity with transparency characteristics are required to avoid undesirable voltage drops and the Joule heating effect in the device, especially for current based devices such as organic light emitting diodes and solar cells. Both the flexibility of the conductive layer and strong adhesion to the substrate are required to keep the conductive layer from delamination. Surface smoothness is also important because the thickness of active layer in these electro-optical devices is typically in the range of tens of nanometers. Any spikes on the electrode layer can cause an undesirable short circuit that leads to device failure.

Early flexible OLED attempts used indium-doped tin oxide (ITO) as the conductive layer in transparent electrodes. However, device flexibility and performance are quite limited in these electrode constructs. Various other transparent electrodes have been investigated in order to replace ITO electrodes to enhance the flexibility of the thin film devices.

Vapor deposition methods such as plasma vapor deposition (PVD) or chemical deposition (CVD) are conventional process that could be used to produce flexible transparent electrodes. However, vapor deposition schemes require complicated equipment and a huge capital investment, greatly increasing the cost of the device fabrication process. In addition, the materials available for use in such conventional vapor deposition processes are limited to mainly metal oxides or mixed metal oxides, such as indium-tin mixed oxide (ITO), antimony-tin mixed oxide (ATO), fluorine-doped tin oxide (FTO), and aluminum-doped zinc oxide (Al—ZO). Although electrodes produced from these materials may be both transparent and moderately conductive, metal oxides are found to be brittle and the adhesion to the substrate is poor. Such electrodes do not survive in applications that require repeating deformations.

Another approach is a sol-gel process for applying metal oxides or mixed metal oxides by hydrolysis and partial condensation of a precursor to form a stable sol followed by a normal coating process. The wet coating undergoes a thermal curing process to form a continuous polymeric metal oxide or mixed metal oxide network. However, coatings formed by sol-gel process typically have a loose and porous structure and have low conductivity. Densification of the coating requires an annealing process at temperatures much higher than the flexible substrate can endure. This process is therefore unsatisfactory.

In a further possible method, conductive nano-particles, nanotubes, nano-sheets, or nano-wires may be dispersed in a solution to form a stable formulation that is then applied to a flexible substrate by a normal coating method, such as spray, dip, flow, slot coating, and Meyer rod methods. However, nano-materials produced by these methods are not stable in solution and tend to form agglomerations after initial dispersion. Therefore, a dispersant must be used to stabilize the dispersion. Typical dispersants are nonconductive and must be removed during the coating process or shortly afterwards to maintain the conductivity of the coating. Coatings often delaminate from the substrate during the washing process. Decomposing and burning off of the dispersant from the coating is not an option because the flexible substrate cannot endure extremely high temperatures.

Coatings formed on a substrate by conventional spray, dip, or Meyer rod methods also suffer large surface-height variations, typically well above 100 nm, which can often be greater than the thickness of active layer in a typical electro-optical device. These spikes on the electrode layer can cause undesirable short circuits that lead to device failure.

Accordingly there is a need for flexible transparent electrodes with excellent optical transparency, electrical conductivity, conductive layer flexibility and strong adhesion to the substrate and active surface smoothness. A need also exists for a method which renders a low cost, scalable process for producing a flexible transparent electrode for use in optical-electrical devices. The present invention satisfies these needs, as well as others, and is generally an improvement over the art.

BRIEF SUMMARY OF THE INVENTION

The present invention provides methods for producing nanowire-polymer composite electrodes that are flexible, with excellent optical transparency, electrical conductivity, surface smoothness and flexibility with a conductive layer that is strongly adhered to the polymer support substrate. The present invention is also related to the use of such electrodes with optical-electrical devices.

The preferred method for producing a flexible transparent electrode begins with a conductive nanowire or nanotube dispersion that is applied to a platform that has a smooth solid formation surface to deposit a porous conductive layer. More than one layer of conductive nanowires or nanotubes can be applied to form the conductive layer. A mixture of different types of conductive nanoparticles can also be deposited to form the initial conductive layer. The platform with the formation surface can be made from glass, silicon wafer, a metal plate or the outer cylindrical surface of a drum.

A polymerizable monomer is then applied to the conductive layer that diffuses into the porous nanowire coating layer and is then polymerized in-situ to form a polymer film composite. The nanowire deposit can optionally be annealed prior to the application of monomers to the conductive nanowire layer. A combination of two or more different polymers can also be applied to the conductive layer.

By this process, the initial nanowire coating is transferred into the polymer film forming a nanowire-polymer composite where most of the nanowire network is embedded near the surface of the composite film, with a certain portion of the nanowires exposed on the surface, forming a conducting surface that is suitable for use as an electrode for electronic devices. The embedded structure of the electrode provides strong adhesion between the conductive layer and the polymer substrate layer.

Optionally, an outside surface coating formulation may be applied on top of the polymer film and cured to form a hard coating or to create other functional layers. The hard coat outer layer can provide protection from scratches during fabrication of the electronic device and durability for the end user.

The resulting polymer film composite is thereafter peeled off from the formation surface of the platform. A smooth conductive surface is formed from the transfer from the smooth surface of the solid substrate that may be joined to active elements of an electronic device. The flexible transparent electrode produced from the current invention can be used in a number of optical electronic devices including but not limited to light emitting diodes, solar cells, touch screen panel, liquid crystal displays, and electrochromic displays.

The nanowires or nanotubes used for the conductive coating are electrically conductive and include, but are not limited to: nanowires of a metal such as silver, copper, aluminum, gold, nickel, stainless steel, or platinum; nanowires or nanotubes of a conducting polymer such as polypyrrole, polyaniline, polythiophene, poly(3-methylthiophene), poly(3,4-ethylenedioxythiophene); and nanowires or nanotubes of a ceramic conductor such as indium doped tin oxide, or a mixture thereof. In one embodiment, metal nanowires were mixed with nanowires or nanotubes of carbon such as single wall or multi walled carbon nanotubes and carbon fibers and the mixture was deposited on the smooth surface of the platform to form the conductive layer.

In another embodiment, nanowires of one type of conductor were applied over a first layer of nanowires of a different conductor.

The polymerizable monomer may be a liquid molecule such as an acrylate ester, methacrylate ester, acrylic acid, methacrylic acid, acrylamide, methacrylamide, styrene, methyl styrene, various epoxides, or a mixture thereof. The monomers may contain one, two, or more polymerizable functional groups. The monomer may be a gas at ambient condition or in a high vacuum, and the vapor molecules diffuse into the nanowire coating and polymerize to form a polymer film. One preferred embodiment of the nanowire coating is a transparent or semi-transparent coating with a thickness in the range of 10 nm to 200 nm.

In another embodiment, an optional releasing agent is deposited on the surface of the platform to facilitate the separation of the composite film from the platform. Preferred releasing agents include fluorocarbons; zinc stearate; silicone; and a polysiloxanes.

An optional adhesion promoter can be added to the monomers to promote bonding of the polymer film with the porous conductive layer. Light transducing particles can also be added to the monomers to reduce the total internal reflection of light through the composite film. One preferred additive to the monomer coating are particles that absorbs light at one wavelength and re-emits light at a longer wavelength.

According to one aspect of the invention, a process is provided for producing a flexible transparent conductor composite that is formed by coating a smooth surfaced platform with at least one conductive coating of nanowires, nanotubes or other conductive particulates; overlaying the conductive coating with a curable monomer liquid; annealing the monomer with thermal exposure or irradiation to form a composite polymeric film, and then removing the film from the platform surface.

Another aspect of the invention is to provide a conductive electrode that has shape memory properties that can be bent or stretched when an external load is applied to the electrode device.

According to a further aspect of the invention, a flexible transparent conductor composite is provided where the composite is a rigid solid at ambient temperature and softens at an elevated temperature and can be deformed and the deformation can be locked by lowering the temperature to the ambient temperature.

In another aspect of the invention, a flexible transparent conductor composite is provided where the composite is an elastomer at ambient temperature and can be deformed and the deformation is reversed when applied stress is removed.

According to another aspect of the invention, a process for producing a flexible transparent conductor composite in continuous sheets or strips is provided.

Another aspect of the invention is to provide a flexible conductive electrode for use in electronic devices such as a solar cell, a photodetector, an electrochromic device, a sensory device, a light emitting device, a liquid crystalline display, a touch screen sensor or a transistor.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 6A is graph of the current density-Voltage-Luminance curves of PLEDs with the AgNWs/polymer substrate before and after 10 bending-releasing cycles of up to 8% compressive strain in the PLEDs FIG. 6B is a graph of the luminous efficacy-current density curve of the fresh device and the bent device of FIG. 5B.

Figure 7B:
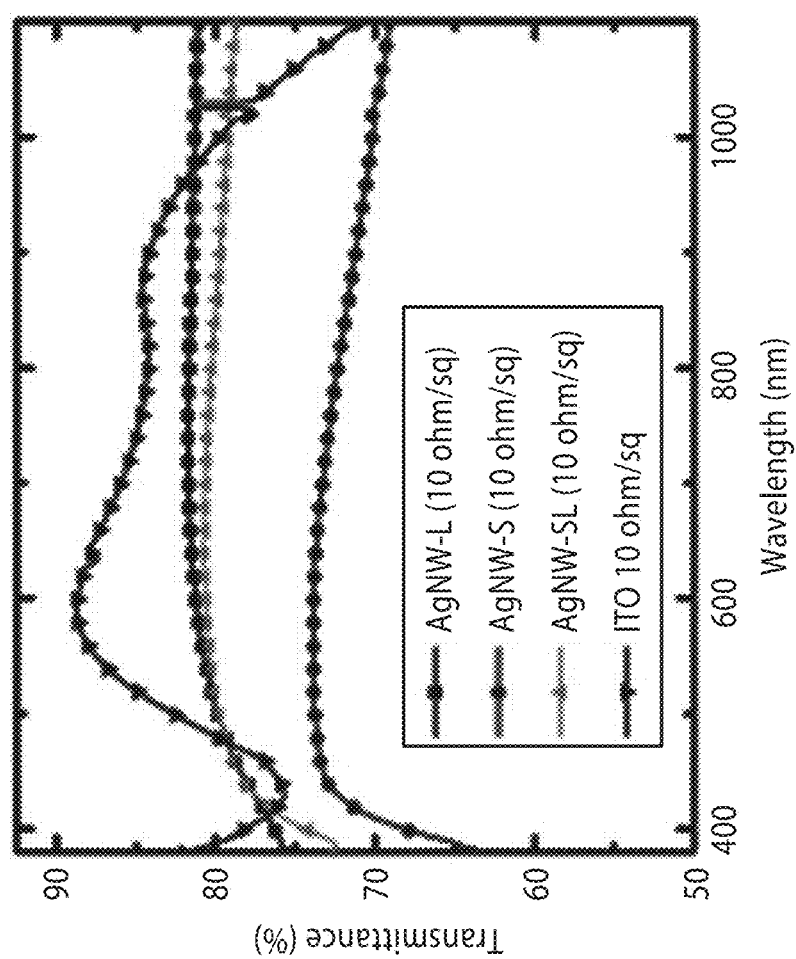

FIG. 7A is a graph of the transmittance spectra of AgNW-S (short) and AgNW-L (long) polymer composite electrodes with specified sheet resistance values FIG. 7B is a graph of transmittance spectra of 10 ohm/sq sheet resistance AgNW-S, AgNW-L and AgNW-SL mixed composite electrodes. The spectrum of a 10 ohm/sq ITO/glass is also shown for reference. All transmittances are inclusive of the polymer substrate.

Figure 8:
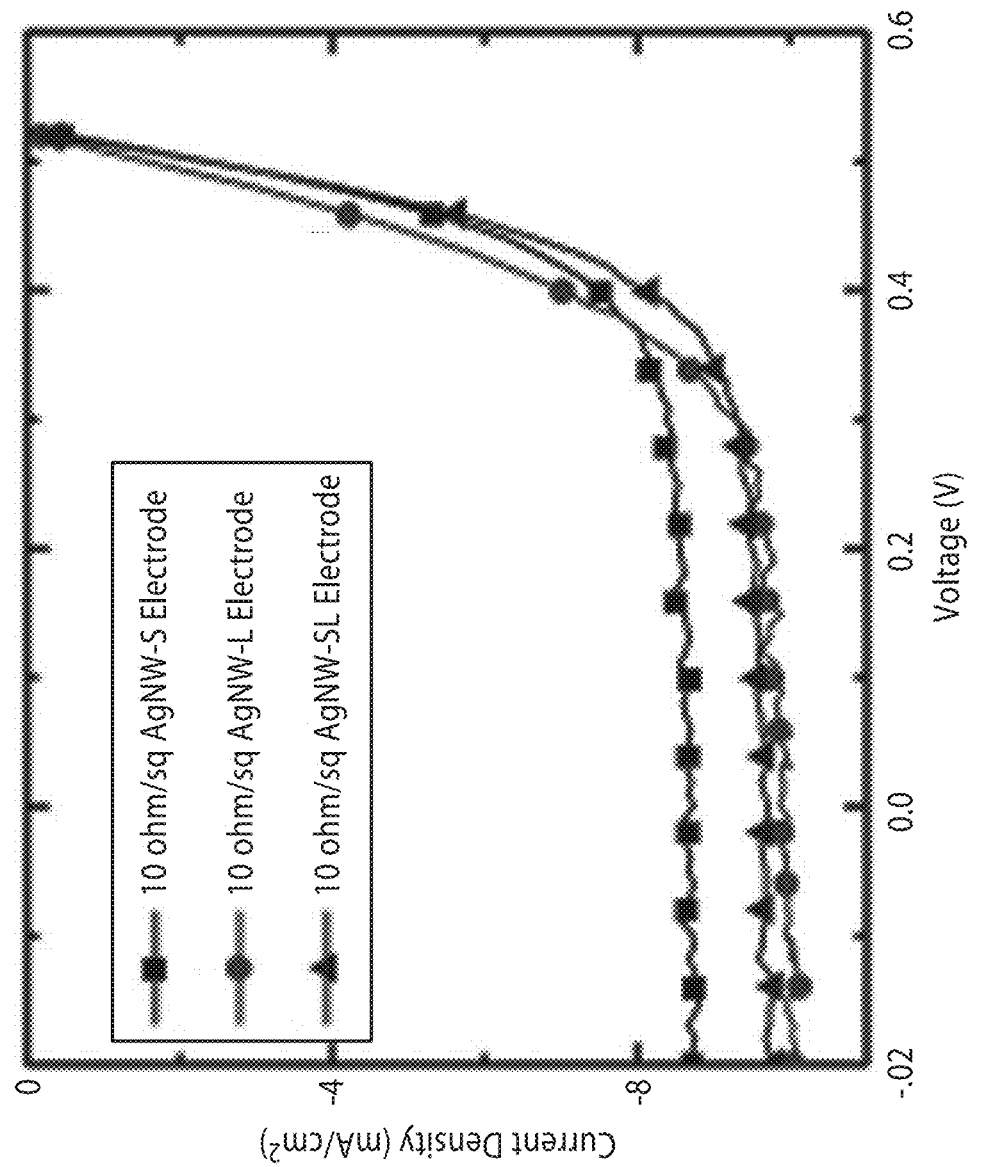

FIG. 8 is a graph of I-V characteristics under simulated AM1.5 solar irradiation with 100 mW/cm$^2$ intensity for devices with various AgNW composite electrodes. All electrodes have 10 ohm/sq sheet resistance.

Figure 9:
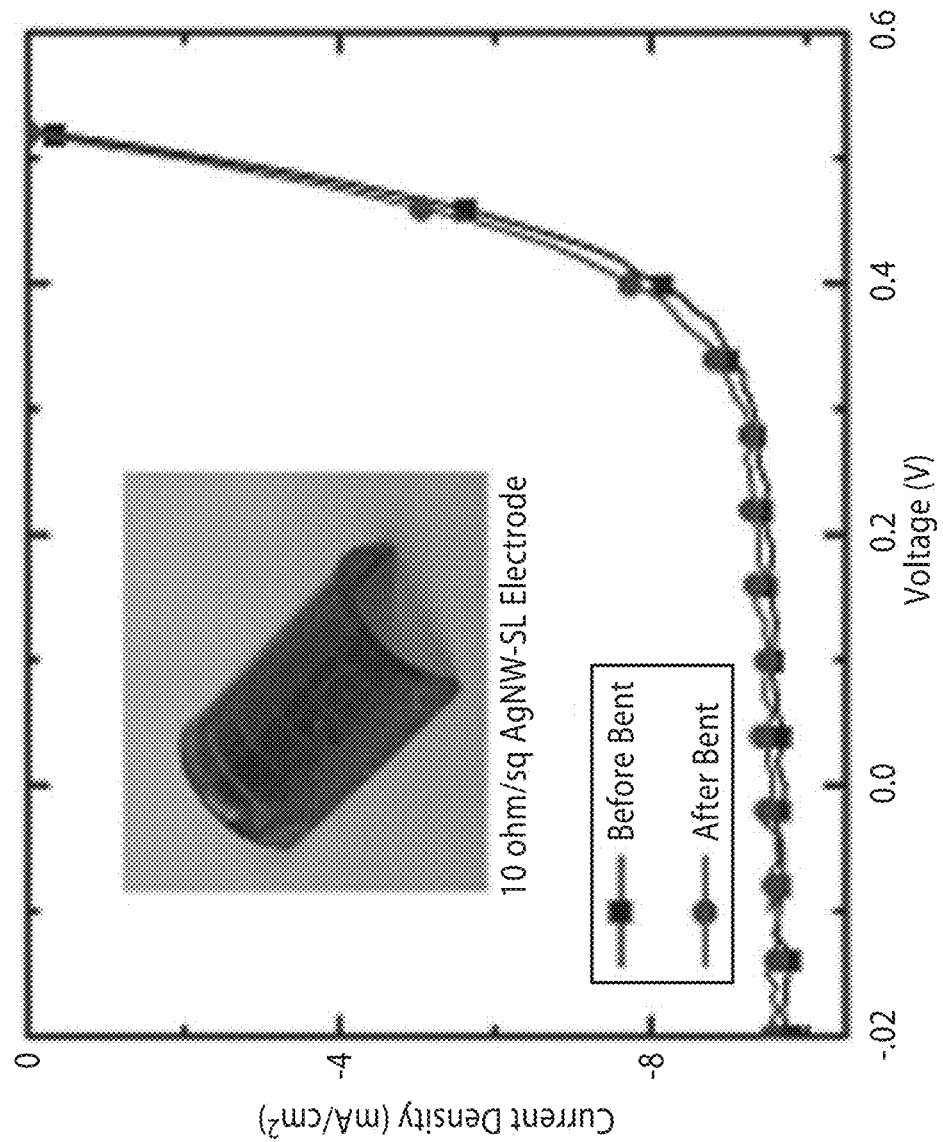

FIG. 9 is a graph of I-V characteristics under simulated AM1.5 solar irradiation with 100 mW/cm$^2$ intensity for devices with AgNW composite electrodes before and after bending.

DETAILED DESCRIPTION OF THE INVENTION

Referring more specifically to the drawings, for illustrative purposes the present invention is embodied in the apparatus and methods generally illustrated in FIG. 1 through FIG. 9. It will be appreciated that the apparatus embodiments may vary as to configuration and as to the details of the parts, and that the methods may vary as to the specific steps and sequence, without departing from the basic concepts as disclosed herein.

The present invention relates to devices and methods for manufacturing transparent and flexible nanowire or nanotube polymer composite electrodes with very smooth active surfaces. Generally, a nanowire conductive layer is formed on the surface of a smooth solid platform. At least one type of monomer is then applied to diffuse into the porous nanowire coating and is thereafter polymerized in-situ to form a polymer film-conductor composite. Optionally, an additional coating formulation can be applied on top of the polymer film and cured to form a hard coating. The polymer film electrode is peeled off from the surface of the platform and used with a variety of electronic devices that need a transparent, flexible electrode.

Figure 1:
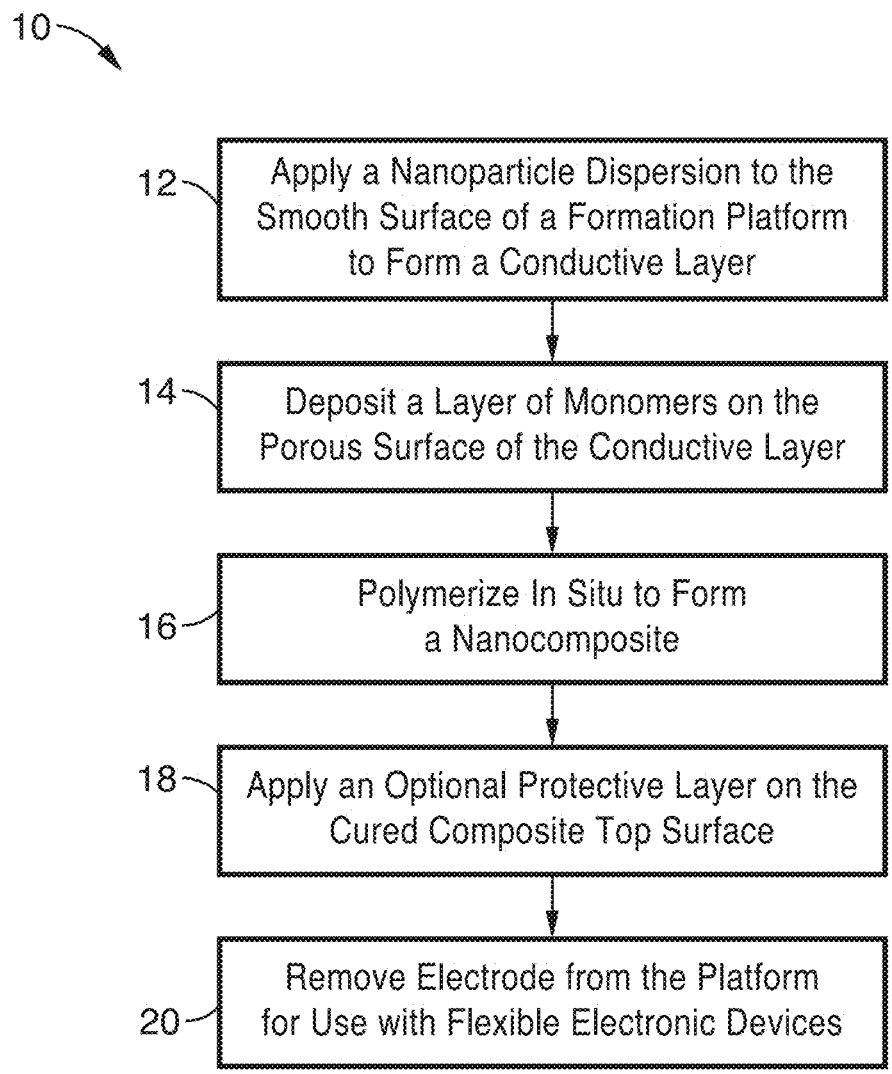
FIG. 1 is a schematic flow diagram of one method for producing a flexible electrode according to the invention.

Turning now to FIG. 1, a flow diagram for one method 10 for manufacturing a nanowire-polymer composite electrode is schematically shown. At block 12, a dispersion of conductive nanoparticles such as nanowires or nanotubes is applied to a smooth surface of a formation platform to form the primary conductive layer. Although an application of one layer of nanotubes or nanowires is used to illustrate the methods, it will be understood that more than one type of nanoparticulate can be used and more than one application of a dispersion can be made to form the conductive layer. Mixed types of nanoparticulates are also contemplated.

Suitable platforms with smooth surfaces on which the conductive layer is formed include glass, silicon wafer, polymer sheet, or metal in planar sheets or drums. Preferably, such platforms provide a surface with roughness of less than 10 nm and a soften point higher than 200° C. Glass sheets or silicon wafers are particularly preferred.

Optionally, the surface of the formation platform can be pretreated by a mold releasing agent to ease the final electrode peel off process. Mold releasing agents that are selected should have low surface energy and high decomposing temperatures. Suitable mold releasing agents include fluorocarbon based mold releasing agents; zinc stearate based mold release agents; silicone based mold releasing agents; polysiloxane based mold release agents; and self-assembled monolayer compounds. Fluorocarbon based mold releasing agents are preferred because they form permanent coatings on the surface of the formation platform and will not be transferred to conductive layer of the final transparent electrode. Flourocarbon releasing agents also provide high temperature stability and open more options for conductive layer treatment.

Suitable methods for forming a nanowire coating is by drop casting, dip coating, inkjet printing, screen printing, Stylus plotting, Meyer rod or doctor blade coating, slot coating or flow coating. One preferred embodiment of forming is by spray coating especially by a sonication spray coating process. During the sonication spray process, the formulation of the nanowire is sonicated in-situ when it leaves the spray nozzle. The solvent is mostly evaporated when the nanowires hit the surface of the solid substrate, preventing re-agglomeration. The coating formed in this way provides fully de-agglomerated nanowire films. In addition, there is no wetting problem when the solid surface was pretreated by a mold releasing agent.

In another embodiment, the method for forming a mixed nano-wire coating is by spraying a formulation containing a mixed nano-material or by spraying several formulations that contain different types of nano-materials in the alternative. One preferred embodiment of the conductive nanowire layer is the application of a transparent or semi-transparent coating of nanowires with a layer thickness in the range of 10 nm to 200 nm.

The preferred formulation for the creation of the conductive layer at block 12 of FIG. 1 comprises a conductive nano-particulate material in a solvent system with optional dispersant. Suitable nano-materials include nanowires or nanotubes of a metal such as silver, copper, aluminum, gold, nickel, stainless steel as well as nanowires or nanotubes of a conducting polymer such as polypyrrole, polyaniline, polythiophene, poly(3-methylthiophene), poly(3,4-ethylenedioxythiophene), or nanotubes or nanowires of a ceramic conductor such as indium doped tin oxide. Preferred nanomaterials can also include combinations of two or more nanowires, nanotubes and nanofibers such as combinations of silver nanowires with copper nanowires or gold nanowires or carbon nanotubes or conductive metal oxide nanotubes.

In one preferred embodiment, a mixture of the nanomaterial contains at least 5% of silver nanowires is provided for dispersion at block 12 of FIG. 1. More preferably, the mixture of nanomaterial contains at least 10% of sliver nanowire yet more preferably, the nanomaterial contains at least 50% of silver nanowire.

The metal nanowire layer can also be coated with a second coating of a different metal nanowire or with carbon nanotubes or a conductive polymer to form the conductive layer. For example, a conductive layer ranging from 20%-99% silver nanowires and a graphene nanosheet or carbon nanotube layer can be used to form the conductive layer. Likewise, the conductive layer can be made from a layer of carbon nanotubes and a layer of silver nanowires coated successively on the smooth platform surface. Carbon nanoparticulates are typically used in combination with metal nanowires to improve conductivity because carbon nanotubes have semiconductive properties.

Suitable solvents for use with the nano-material dispersion at block 12 include water, methanol, ethanol, propanol, isopropanol, butanol, isobutanol, secondary butanol, tertiary butanol, cyclohexanol, pentanol, octanol, decanol, ethylene glycol, diethylene glycol, triethylene glycol, propylene glycol, dipropylene glycol, tripropylene glycol, butylene glycol, dibutylene glycol, tributylene glycol, diacetone alcohol, 1-methoxy-2-propanol, 2-propoxyethanol, dimethyl ether, diethyl ether, di-n-butylether, ethylene glycol dimethyl ether, propylene glycol dimethyl ether, propylene glycol methyl ether, dipropylene glycol methyl ether, tripropylene glycol methyl ether, dipropylene glycol dimethyl ether, tripropylene glycol dimethyl ether, ethylene glycol butyl ether, diethylene glycol butyl ether, ethylene glycol dibutyl ether, ethylene glycol methyl ether, diethylene glycol ethyl ether, diethylene glycol dimethyl ether, ethylene glycol ethyl ether, ethylene glycol diethyl ether, tetrahydrofuran, dioxane, acetone, methyl ethyl ketone, cyclopentanone, cyclohexanone, methyl isobutyl ketone, ethyl acetate, n-propyl acetate, n-butyl acetate, t-butyl acetate, propylene glycol monomethyl ether acetate, dipropylene glycol methyl ether acetate, ethyl 3-ethoxypropionate, ethylene glycol ethyl ether acetate, and mixtures thereof.

Particularly useful solvents include water, methanol, ethanol, isopropanol, 2-methoxyethanol, 1-methoxy-2-propanol, ethyl acetate, n-butyl acetate, t-butyl acetate, 2-propoxyethanol, propylene glycol monomethyl ether acetate, and mixtures thereof. One or more solvents may be used in various amounts to assist in obtaining desired coating conditions.

In another embodiment, the treatment of the initially formed nanowire coating on the smooth surface of the platform is preferred before applying the polymer film at block 14. Suitable treatment methods for the initial conductive layer include thermal annealing, plasma treatment, UV or other irradiative treatment. The purpose of the treatment is to minimize the contact resistance between the nanowires and to enhance the conductivity. A thermal annealing process is particularly preferred. The temperature for annealing is preferably at least 100° C. and more preferably at least 150° C. for certain period of time, preferably at least for 5 minutes. In addition, the annealing temperature is selected below the decomposing temperature of the optional mold release agent, and more preferably at the temperature below 300° C.

The treatment may include a chemical reaction that helps remove non-conductive oxide layer on the surface.

Turning now to block 14, a layer of at least one type of monomer is deposited on the porous surface of the conductive layer produced at block 12. The monomer that is applied at block 12 diffuses into the porous nanowire coating and is then polymerized in-situ to form a polymer film composite at block 16 of FIG. 1. One embodiment of the invention is a laminate composite electrode consisting of a polymer film that is at least 100 micrometers thick and a composite electrode layer that is thinner than the polymer film.

In another embodiment, an optional adhesion promoting compound is added to the monomers to promote bonding of the polymer film with the porous conductive layer. Adhesion promoter compounds preferably contain at least a functional group selected from metacrylate, acrylate, epoxide, or styrene, and a second functional group selected from carboxylic acid, amine, alcohol, thiol, silane, aromatic group.

The polymeric film that is formed at block 16 is preferably produced by polymerizing an applied liquid monomer with a cationic or free radical photo-initiator. The monomer that is applied may be a liquid molecule such as an acrylate ester, methacrylate ester, acrylic acid, methacrylic acid, acrylamide, methacrylamide, styrene, methyl styrene, various epoxides, or a mixture thereof. The monomers may also contain one, two, or more polymerizable functional groups. The monomer may be a vapor at ambient condition or in a high vacuum, and the vapor molecules diffuse into the nanowire coating and polymerize to form a polymer film.

Examples of cationic type UV curing catalysts that may be used include diaryliodonium salt, dialkylphenacylsulfonium, ferrocenium salt, triarylsulfonium salt and the like and mixtures thereof. Especially suitable for use with cationic type UV curing catalysts include those with epoxy groups and epoxycyclohexyl groups.

Examples of free-radical type UV curing catalysts include benzoin; benzoin alkyl ethers; acylphosphine oxides; 1,1-diethoxyacetophenone; 1-benzoylcyclohexanol; benzophenone; 2,2-dimethoxy-2-phenylacetophenone; 2-methyl-1-[4-(methylthio)phenyl]-2-(4-morpholinyl)-1-propanone; 1-hydroxycyclohexyl phenyl ketone; and the like, and mixtures thereof. Particularly suitable free-radical UV curing catalysts include acrylate and methacrylate monomers.

The amount of UV curing catalyst present with the monomer may be described by using a catalyst ratio. The curing catalyst ratio is defined as the ratio of the amount of catalyst in grams to 100 grams of the monomer. In some embodiments, the UV catalyst ratio may be greater than about 0.1, greater than about 0.5, greater than about 1, or greater than about 2. In some embodiments, the UV catalyst ratio may be less than about 15, less than about 10, less than about 7, or less than about 5.

In another embodiment of the invention, the monomer film that is applied at block 14 and polymerized at block 18 is made from a shape memory polymer. For example, the shape memory polymer is an elastic polymer that has a glass transition temperature below 20° C. in one embodiment. The polymer is a rigid polymer at below 20° C. In another embodiment, the shape memory polymer has a glass transition temperature above 100° F. so that the polymer is rigid at ambient conditions and elastic at higher temperatures. Another preferred embodiment of the shape memory polymer is a polymer that can be stretched by at least 10%, reversibly, at a temperature above the glass transition temperature. One embodiment of the shape memory polymer is poly(tert-butylacrylate) formed from tert-butylacrylate. Thermal annealing of the polymer enhances its shape memory property. Tert-butyl acrylate can also be copolymerized with a difunctional or multi-functional acrylate, methacrylate to effect a chemically crosslinked shape memory polymer with better resistance against solvents.

In another embodiment of the invention, the monomer film that is applied at block 14 and polymerized at block 18 is a mixture of at least two different monomers. One monomer contains a functional group that can form strong bonds with the surface of the conductive nanomaterial. An example of the monomer is acrylic acid for strong bonding with the silver nanowire. Another embodiment includes a second monomer containing an amino group for strong bonding with carbon nanotubes, for example.

In a further embodiment, the applied monomer layer contains light-transducing particles. For example, the particles in the monomer layer can be transparent particles that scatter light in the polymer composite and reduces the total internal reflection of light. Examples of such particles include polystyrene nanoparticles, polystyrene microparticles, polystyrene beads, silica nanoparticles, alumina nanoparticles, metallic nanoparticles. In another embodiment, the additional particles are phosphor pigments that absorb light of one wavelength and re-emit at a longer wavelength. Examples of these particles include organic laser dye molecules such as cumarin-6, rubrene, IR-1048, IR-783, rhodamine 6G. In another embodiment, the particles comprise particulates of a phosphorescent compound. These particles may be added in the liquid monomer to form a uniform dispersion in the resulting polymer film.

An optional top protective layer can be applied to the cured composite at block 18 of FIG. 1 to provide additional stability and durability to laminate composite electrodes. In one embodiment the protective coating of the composite film is a coating of a flexible monomer that is cured before removal of the final film from the platform. In another embodiment, a transparent polymer film is applied onto the monomer coating before the monomer coating is cured and the monomer coating and the protective coating are cured simultaneously. Examples of the polymer top coating include polymers of a polyester, a polyimide, a polymethyl methacrylate, a polyurethane, and a polycarbonate.

The final polymer nanocomposite electrode that is formed is peeled off of the surface of the formation platform at block 20 of FIG. 1. The resulting electrode that has been removed from the platform has a bottom surface that is very smooth and has certain portion of the nanowires exposed on the bottom surface, forming a conducting surface that is suitable for use as an electrode in many different electronic devices. In one embodiment, a transparent conductive composite consisting of a metal nanowire network embedded in the conductive surface has been produced with surface height variations of between approximately 5 nm and approximately 50 nm. Height variations of between 10 nm and 30 nm in the conductive smooth surface of the electrode are particularly preferred.

The electrodes produced by this method can be manufactured in different configurations from long ribbons to large sheets and may be adapted to irregular shapes. The flexible transparent electrode produced from the current invention can be used in a number of optical electronic devices including but not limited to light emitting diodes, solar cells, touch screen panels, liquid crystal displays, and electrochromic displays.

The invention may be better understood with reference to the accompanying examples, which are intended for purposes of illustration only and should not be construed in any sense as limiting the scope of the present invention as defined in the claims appended hereto.

Example 1

In order to demonstrate the invention, highly flexible silver nanowire (AgNW) electrodes on a cross-linked transparent polymethacrylate substrate were produced and evaluated. In this illustration, the flexibility of the AgNW electrodes was shown by bending up to 16% compressive strain with negligible change in sheet resistance. A 3.9× increase in sheet resistance was obtained at 16% tensile strain. The resistance change is recovered when the deformed electrode returns to its un-deformed shape. The AgNW/polymethacrylate electrodes that were produced were shown to have low surface resistance and high solvent resistivity together with strong adhesion and ultra-low surface smoothness.

The application of such electrode was demonstrated first in the fabrication of solution-processed PLEDs and compared with the device with commercial available ITO electrode. The efficacy of the PLEDs reached a maximum value of 14.0 cd/A, which was higher than the control devices using ITO anode. The polymethacrylate substrate also introduced a shape memory property to the PLEDs. The devices could be bent to various temporary, stable shapes without much reduction in electroluminescent properties. The shape change was reversible and could be repeated for many cycles.

Figure 2:
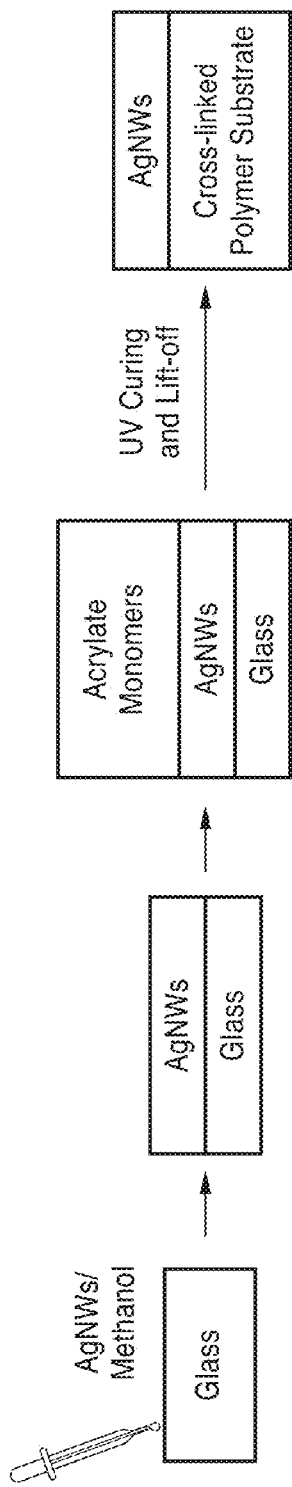
FIG. 2 is a schematic cross-sectional diagram of the succession of applied layers to form one embodiment of a flexible electrode according to the invention.

Referring now to FIG. 2, the transparent electrode fabrication sequence that was used is schematically illustrated. An AgNW dispersion in methanol was drop cast on a pre-cleaned glass platform to form conductive AgNW thin conductive coatings.

A bi-functional methacrylate monomer containing a photo initiator was then cast onto the AgNW layer and subsequently cured by UV irradiation, forming a crosslinked solid overcoat on AgNW layer. An ethoxylated bisphenol A dimethacrylate (SR540 from Sartomer) was used as the bi-functional monomer for the preparation of the crosslinked polymer substrate. The crosslinking reaction was carried out under UV irradiation with 1 wt % photoinitiator added (2,2-Dimethoxy-2-phenylacetophenone from Sigma-Aldrich).

The AgNW conductive layer was intercalated in the crosslinked poly(methacrylate) overcoat during curing. When the composite is peeled off the glass substrate, the surface of the AgNW coating originally facing the glass platform surface becomes the exposed conductive surface on the new polymer substrate. The AgNWs that were employed had an average diameter of approximately 50 nm and an average length of approximately 5 µm as verified from scanning electron microscopy and transmission electron microscopy images.

The surface topography of the AgNW coating on the original glass platform was examined by atomic force microscopy (AFM). It revealed a piled up network consisting of densely and randomly oriented AgNW nanowires. The presence of erected nanowires lead to localized height elevations greater than 500 nm. To the contrary, the surface topography of the AgNW electrodes transferred onto the poly(methacrylate) substrate appeared very smooth. The height variation in the 10 µm×10 µm scanned area is less than 5 nm. The low surface roughness of the AgNW/polymethacrylate electrodes indicates a relatively smooth interface of the AgNW network on the original glass substrate. The high rigidity of the glass platform prevented any penetration of nanowires into glass. During the in-situ formation of the polymethacrylate substrate, the applied liquid monomer penetrated into the AgNW network and filled up the voids, including the space unoccupied by Ag nanowires at the glass interface.

The resulting AgNW/polymer electrodes had high transparency and low sheet resistance comparable to flexible ITO electrodes coated on a polyethylene terephthalate (PET) substrate. The surface roughness of the AgNW/polymer electrodes was less than 5 nm. The electrode was suitable for the fabrication of high-performance of PLEDs. Furthermore, the shape memory property of the substrate leads to shape memorable PLEDs that can be deformed to various stable shapes reversibly without much loss of the electroluminescent properties.

Example 2

The durability and conductivity of the AgNW electrode produced in Example 1 were evaluated. The AgNW/polymethacrylate electrode surface was subjected to repeatedly adhesive tape adhesion and peeling. No nanowires were apparently peeled off of the electrode surface. The sheet resistance was found to remain unchanged after 10 cycles of the Scotch tape test.

To compare the durability of the electrode with conventional films, two AgNW films were prepared: one by vacuum filtration and the other by a Meyer rod coating process. The first electrode film was made by vacuum filtration and transferred to plastic substrate by pressing the filter cake and lift off of the filter media. The sheet resistance-transmittance of electrode was 13 Ω/sq and 85% transmittance at 550 nm. The second AgNW film that was formed by Meyer rod coating had a sheet resistance of 20 Ω/sq and 87% transmittance at 550 nm. After scotch tape text, all AgNW layers were shown to be removed from both coatings. This comparative example demonstrated that AgNW electrodes prepared by the current invention showed comparable surface resistance yet much superior adhesion properties than those from a vacuum filtration process or a Meyer rod coating process on PET film.

Durability of the AgNW electrodes was also tested with exposure to organic solvents. The AgNW/polymethacrylate electrodes were prepared and treated with commonly used organic solvents, including acetone, dichlorobenzene, chloroform, toluene, and tetrahydrofuran. No swelling or dissolution of the polymethacrylate substrate was observed after immersion of the electrodes in these solvents. The sheet resistance of the AgNW electrodes was found to be intact after the solvent treatment.

Figure 3:
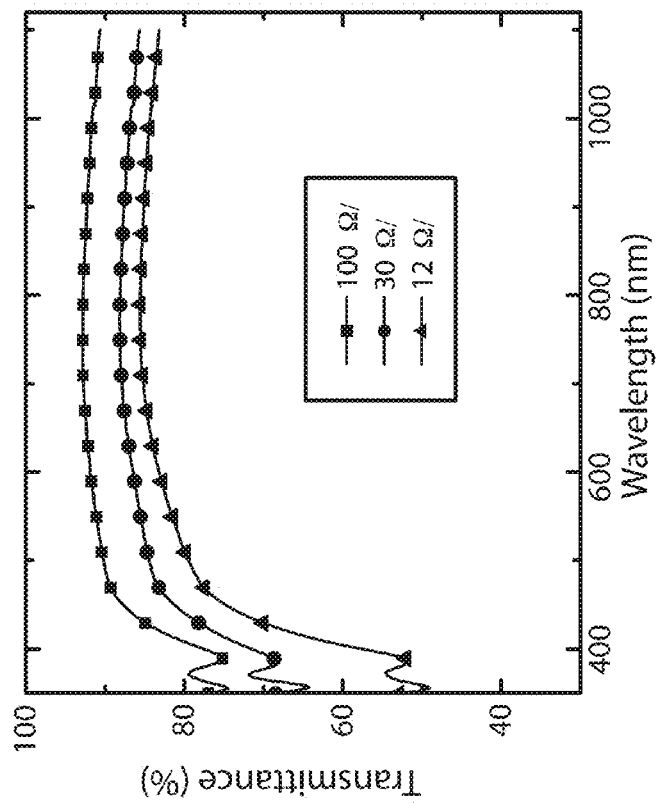
FIG. 3 is a graph of transmittance spectra of the AgNW electrode/polymethacrylate substrate. An uncoated polymethacrylate substrate (~91% transmittance at 550 mm) was used as a reference.

The transmittance of the AgNW electrodes on polymethacrylate substrate with various sheet resistances is shown in FIG. 3. An uncoated polymethacrylate substrate (~91% transmittance at 550 mm) was used as the reference. The transmittance at 550 nm wavelength reaches 91% when the sheet resistance is 100 Ω/sq; 86% at 30 Ω/sq, and 82% at 12 Ω/sq. These values were comparable to commercially available ITO electrodes coated on plastic PET substrates.

Example 3

Figure 4:
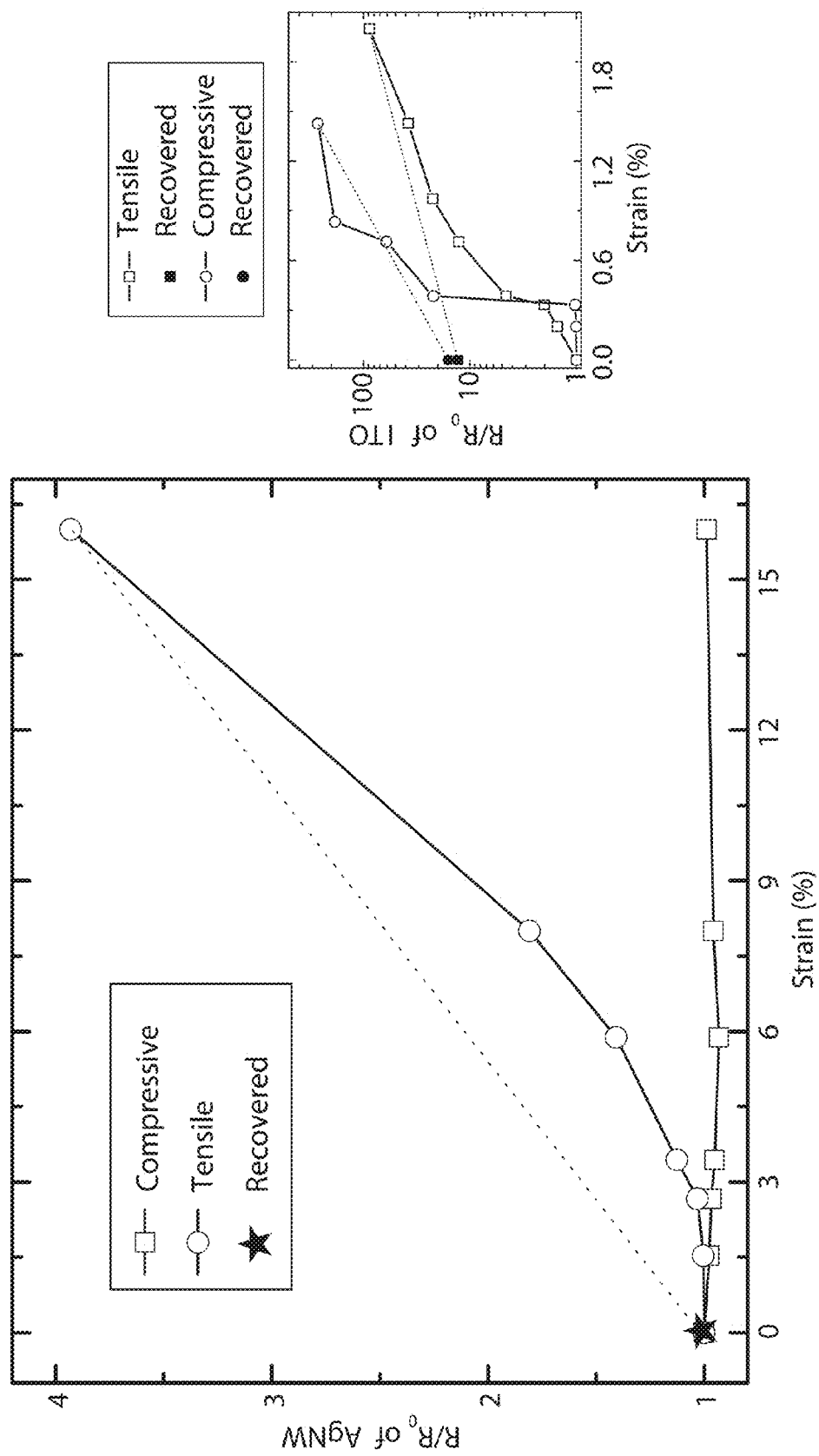
FIG. 4 is a graph of the surface resistance change (R/R0) of the AgNW/polymer electrode with tensile and compressive strains (inset shows the resistance change of an ITO/PET substrate upon tensile strain (initial sheet resistance was 40 Ω/sq).

Flexibility of AgNW electrode was also evaluated. Surface resistance change (R/R0) of the AgNW/polymer electrode with tensile and compressive strains are shown in FIG. 4. The inset of FIG. 4 shows the resistance change of an ITO/PET substrate upon tensile strain where the initial sheet resistance was 40 Ω/sq.

The polymethacrylate film has a glass transition temperature (Tg) of 110° C. The network polymer imparts shape memory property to the AgNWs/polymethacrylate electrode. When heated to higher than 110° C., the electrodes could be stretched by up to 16% and bent to small curvature radii. Upon cooling to below 110° C., the deformed shape was "frozen." The deformed electrodes relaxed from the temporary shape to the original ones when the deformed ones were heated to above Tg without the application of external tension or compression. Various temporary shapes were also created.

The resistance change of the AgNWs/polymethacrylate electrode was measured as a function of the strain of the AgNW electrode. The electrode was bent to various concave and convex shapes. The compressive or tensile strain of the AgNW electrode surface was calculated from the curvature change. The results are depicted in FIG. 4. The resistance of the AgNW electrode shows a slight trend of decreasing with compressive strain. At 6% strain, the trend is reversed to gradual increase strain. Overall, the resistance change is small, and the resistance at 16% strain is almost the same as that of the un-deformed electrode. In the case of tensile deformation, the resistance increases with strain and becomes 3.9× that of its original value when the strain reaches 16%. The resistance change was reversible and the recovered shape shows the same resistance as the original electrode.

For comparison, an ITO electrode on PET substrate was tested for flexibility. Commercial available ITO/PET electrodes were tested for flexibility. The resistance of the ITO electrode increases to 88× after 2% tensile strain and to 267× after 1.5% compressive strain. The changes are not-recoverable: the resistance is more than 10× higher than its original value after the electrodes deformed to 2% tensile or 1.5% compressive strain are allowed to return to the original shape. This example demonstrated AgNW electrode from the current invention has superior flexibility compared to a commercial ITO PET electrode.

Example 4

In order to test the electrode with an electronic device, a Polymer LED was fabricated using AgNW electrode. AgNWs/polymer or ITO/glass electrodes were prepared as described in Example 1. The electrodes were cleaned successively with detergent, deionized water, acetone and isopropanol for 5 minutes each under ultrasonication. PEDOT:PSS aqueous solution was then spun cast at 4000 rpm. The resulting PEDOT:PSS layer was around 40 nm thickness as measured by a Dektak profilometer. The light emitting polymer, SY-PPV, was dissolved in toluene (6 mg/mL) and spun cast at 1500 rpm, resulting in a 60 nm thick polymer layer. A composite cathode consisting of 1 nm thick cesium fluoride and 100 nm thick aluminum was deposited by physical vapor deposition at $3 \times 10^{-6}$ mbar to complete the fabrication of the PLEDs. The active device area defined by the shadow mask for the cathode deposition was as 14 mm$^2$. The devices were tested in a nitrogen filled dry box with oxygen and moisture levels below 1 ppm. The current density-voltage-luminance (I-V-L) curves were measured with a Keithley 2400 source meter and a calibrated silicon photodetector.

Figures 5A, 5B:
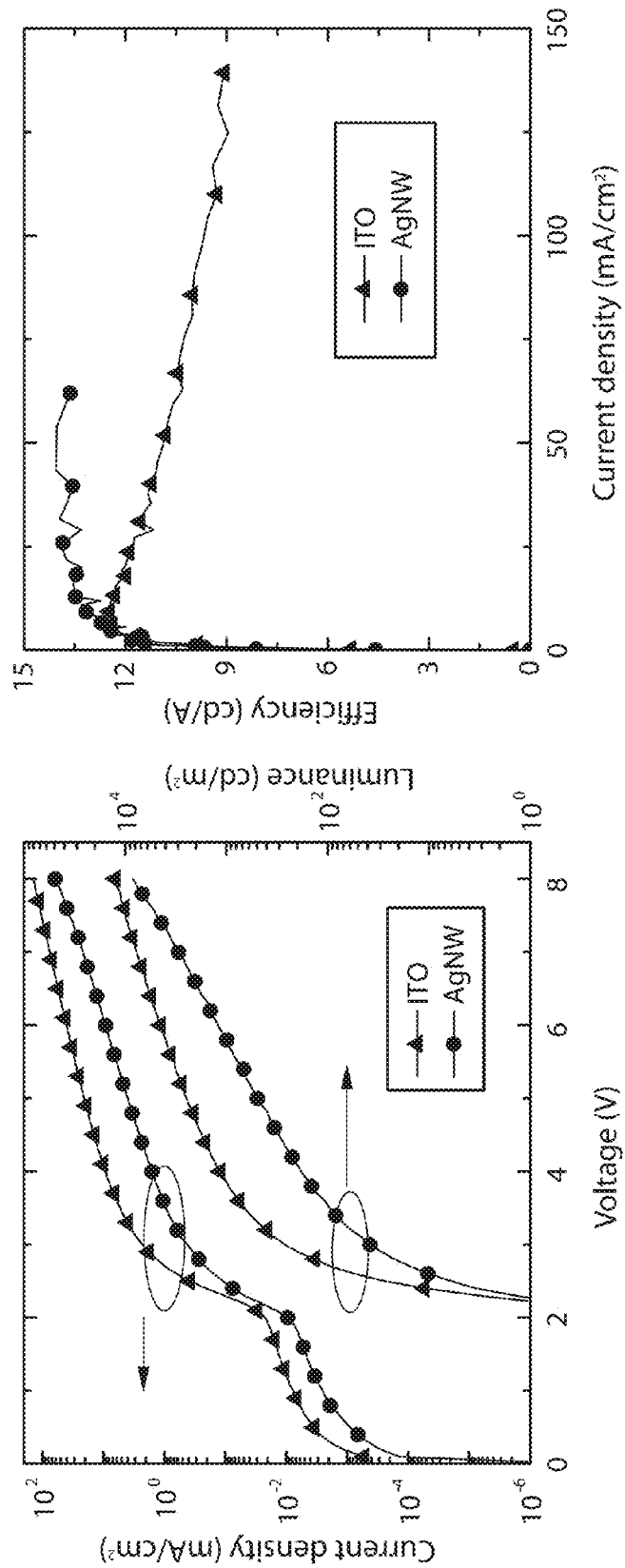
FIG. 5A is a graph of current density-Voltage-Luminance curves of PLEDs having a sandwich structure of AgNWs or ITO anode/PEDOT:PSS/SY-PPV/CsF/Al.
FIG. 5B is a graph of the luminous efficacy-current density curve of the devices of FIG. 5A.

Performance of the polymer LED using AgNW electrodes was also evaluated. AgNW/polymethacrylate electrodes with 30 Ω/sq sheet resistance were prepared and were used for the fabrication of solution-processed PLEDs. The device had a sandwich configuration of polymethacrylate/AgNW/PEDOT:PSS/SY-PPV/CsF/aluminum, wherein PEDOT:PSS was poly(3,4-ethylenedioxythiophene) doped with polystyrene sulfonate (from H. C. Stark) and SY-PPV is an alkoxyphenyl substituted yellow emissive poly(1,4-phenylene vinylene) (Super-Yellow from Covion). The current density-voltage-luminance (I-V-L) characteristics of the PLEDs were obtained by sweeping the applied voltage from 0 V to 8 V at 100 mV increments. The curves are shown in FIG. 5A. The AgNW device turns on at 2.3V (1 cd/m² brightness) and has a brightness of 8,470 cd/m² at 8 V. The luminous efficacy of the devices are shown in FIG. 5B. The maximum efficacy is 14.0 cd/A.

This polymer LED was compared with a polymer LED made from commercial available ITO on glass. The ITO on glass was obtained from a commercial source with sheet resistance of 10 ohms/sq. ITO based devices were also fabricated having a similar sandwich structure of glass/ITO/PEDOT:PSS/SY-PPV/CsF/aluminum for comparison. The PLEDs with ITO/glass electrodes exhibited quite similar I-V-L responses as shown in FIG. 5A, except that the slightly higher current and luminance at the same applied voltages. Light emission turns on at 2.2 V (1 cd/m2 brightness) and reaches a luminance of 12,650 cd/m² at 8 V.

The luminous efficacy of the devices had a maximum efficacy of 12.5 cd/A as shown in FIG. 5B and were consistent with reported values for devices of similar architecture and lower than device at 14.0 cd/A.

This example demonstrated the polymer LED fabricated from AgNW electrode from the current invention has comparable or better initial performance than ITO/glass commercial available electrode.

Example 5

The operational lifetime of the PLEDs was evaluated under a constant current driving mode with maximum emission intensity of 300 cd/m². The emission intensity underwent steady reduction with time and dropped to 80% of its maximum value after 24 hours of continuous operation.

In contrast, the operational lifetime of a flexible polymer LED by ITO/glass electrode under a constant current driving mode had a maximum emission intensity of 300 cd/m². ITO electrode degraded a little slower and emitted 88% of the peak brightness after 24 hours of continuous operation. This example demonstrated the polymer LED device by AgNW electrode in current invention has comparable life time as that from commercial ITO/glass electrode.

Example 6

The flexibility of the LED device of Example 4 was illustrated by subjecting it to various shape changes and recovery exploiting the shape memory property of the polymethacrylate substrate. FIG. 6A shows the I-V-L and efficacy plots of a PLED before and after 10 bending-recovery cycles with maximum 8% compressive strain. The device was finally recovered to a flat shape when electroluminescent characteristics were measured. A slight change of the I-V-L responses is observed after the bending cycle test; however, the maximum luminous efficacy stays at around 14 cd/A as shown in FIG. 6B. This example demonstrated superior flexibility the AgNW electrode from current invention in active devices.

Shape memory of a flexible Polymer LED with a AgNW electrode was evaluated with a PLED bent to a concave shape (2.5 mm curvature radius and 8% tensile strain in the AgNW electrode, a convex shape (2.5 mm curvature radius and 8% compressive strain in the AgNW electrode), and recovered to the original flat shape. The device was operated at 300 cd/m² brightness. The shape change operation was done at 120° C. The devices could be operated at a high brightness while undergoing shape changes. No significant emission intensity change was observed within the 20 to 30 seconds of heating and shape recovery. The example provided further demonstration of the flexibility of AgNW electrode in current invention.

Example 7

In order to further illustrate the adaptability of the invention, flexible transparent electrodes for polymer solar cells were fabricated with both long and short nanowires in the composite. Short Ag nanowires (AgNW-S) were synthesized and dispersed in methanol (2 mg/ml) and drop cast on a glass platform. An ethoxylated bisphenol-A dimethacrylate (SR540, Sartomer) was used as a bi-functional monomer for the preparation of crosslinked polymer substrates. The liquid monomer was admixed with 2,2-dimethoxy-2-phenylacetophenone (photoinitiator, Sigma-Aldrich) at 1 wt % ratio. The solution was drop cast onto AgNW coatings on the glass platform surface. The liquid layer was subsequently cured under UV irradiation (365 nm wavelength, 10 mW/cm² for 20 minutes). The resulting polymer layer was peeled off the glass platform, transferring AgNW onto the new polymer substrate.

The resulting electrodes were then characterized. SEM images of the conductive surface of short (AgNW-S) and long (AgNW-L) nanowires/polymer composite electrode were obtained. Both the surface and embedded nanowires are visible in the SEM images. The deepest nanowires were located approximately 500 nm underneath the top surface. The electrode surface is smooth with a typical surface roughness within 10 nm for electrodes with 10 ohm/sq sheet resistance.

The transmittance spectra of the AgNW-polymer composite electrodes with various AgNWs were represented in FIG. 7A and FIG. 7B, with the spectra spectrum of ITO-glass electrode as a reference. Apparently, the use of long AgNWs enhances the transparency of the composite electrodes. It can be seen that with the same electrode sheet resistance values, using long AgNWs resulted in about 5-10% transmittance improvement in the visible wavelength range over the short AgNWs. A 10 ohm/sq composite electrode with the long nanowires has around 80% transparency in visible wavelength which is approaching to that of a 10 ohm/sq ITO-glass electrode.

Note that the transmittance of ITO electrode shows a rapid decrease above 900 nm and reaches 70% at 1100 nm. This may be problematic for some small band gap polymers designed to harvest in the near IR wavelength range. The AgNW electrodes, especially the ones with the long nanowires, have a quite flat transmittance extending into the infrared range. The 10 ohm/sq AgNW-polymer composite electrode with long AgNWs had a transmittance of 81% at 1100 nm. The 10 ohm/sq AgNW-SL electrodes exhibited a combined transmittance characteristics of the AgNW-S (S for short) and AgNW-L (L for Long) electrodes and the spectrum closely resembles that of the AgNW-L electrode in the wavelength range between 420 nm and 600 nm. The transmittance also shows a gradual decreasing trend at above the 600 nm wavelength and a relatively fast drop at below 420 nm wavelength.

The conductive surfaces of the AgNW-polymer composite electrodes were also examined with atomic force microscopy (AFM). It was apparent that the use of short AgNWs promoted a much denser electrode surface. The number of nanowires locating on the surface of the short AgNW-polymer electrode is more than 10 times the number in the long AgNW-polymer electrode. The surface nanowire density approximately reflects the percolation threshold density to form a conductive pathway in the nanowire electrodes Example 8

In order to further characterize the electrodes for solar cells, AgNW-polymer electrodes and ITO/glass electrodes were fabricated and cleaned successively with detergent, deionized water, acetone and isopropanol for 5 min each under ultrasonication. PEDOT:PSS aqueous solution (Al4083 from H. C. Stark) was preheated at 80° C. for 30 minutes and spun cast at 4000 rpm for 60 seconds. The PEDOT:PSS was then annealed at 130° C. for 35 mins. The resulting PEDOT:PSS layer was around 40 nm thickness as measured by a Dektak profilometer. The substrate was then transferred into a nitrogen filled dry box with oxygen and moisture levels both below 1 ppm.

The active layer was coated following literature procedures: poly(3-hexylthiophene) (P3HT) and phenyl-C61-butyric acid methyl ester (PCBM) were mixed with 1:1 weight ratio and co-dissolved in 1,2-dichlorobenzen with final P3HT concentration of 20 mg/mL. The resulting solution was spun cast at 600 rpm for 18 seconds and 1100 rpm for 8 seconds. The solvent dried out after about 20 minutes in a covered glass petri-dish. The active layer was further thermally annealed at 140° C. for 5 mins, resulting in a 210 nm thick blend layer. A 1 nm thick LiF layer and a 100 nm thick aluminum were then consecutively deposited by physical vapor deposition at $3 \times 10^{-6}$ mbar to complete the device fabrication. The active device area defined by the shadow mask for the cathode deposition was 14 mm$^2$. The photovoltaic performance was measured under an air mass of a 1.5 solar illumination at 100 mW/cm$^2$ (1 sun). FIG. 8 shows I-V characteristics under simulated AM1.5 solar irradiation with 100 mW/cm$^2$ intensity for devices with various AgNW composite electrodes. All electrodes had 10 ohm/sq sheet resistance.

Example 9

The flexibility of the polymer solar cell with AgNW electrodes that was produced in Example 8 was evaluated. The solar cells were heated at 110° C. for 20 seconds, deformed, and then cooled down to room temperature. Photovoltaic characteristics remain almost unchanged after one cycle of bending to a 5 mm radius curvature and un-bending as shown in FIG. 9. This shape changing corresponds to a maximum linear strain of about 8% in the active layers.

From the discussion above it will be appreciated that the invention can be embodied in various ways, including the following:

1. A method for producing flexible, nanoparticle-polymer composite electrodes, comprising: applying a plurality of conductive nanoparticles to a smooth surface of a platform to form a porous conductive layer; coating the conductive layer with at least one coating of monomers; curing the monomers in situ to form a conductive layer-polymer composite film; and removing the composite film from the platform; wherein a conductive composite film is produced with a conductive smooth surface with surface height variations of 100 nm or less.

2. The method of embodiment 1, wherein the composite film has a polymer layer that is greater than 100 micrometers thick and a conductive layer that is less than 100 micrometers thick.

3. The method of embodiment 1, further comprising depositing a releasing agent on the surface of the platform to facilitate the separation of the composite film from the platform.

4. The method of embodiment 1, further comprising applying a plurality of a second type of conductive nanoparticles to the first application of nanoparticles to form the porous conductive layer.

5. The method of embodiment 1, wherein the conductive nanoparticles are metal nanowires selected from the group of metal nanowire consisting essentially of silver, copper, aluminum, gold, nickel, and stainless steel.

6. The method of embodiment 1, wherein the conductive layer is formed from a mixture of a first type of metal nanowires and a second type of metal nanowires applied to the smooth surface of the platform.

7. The method of embodiment 1, wherein the conductive layer is formed from a mixture of metal nanowires and a conductive particulate selected from the group of particulates consisting essentially of nanowires or nanotubes of polypyrrole, polyaniline, polythiophene, poly(3-methylthiophene), poly(3,4-ethylenedioxythiophene), ceramic conductors, and conductive metal oxides, carbon, and graphene sheets.

8. The method of embodiment 1, wherein the monomer is selected from the group of monomers consisting essentially of an acrylate ester, a methacrylate ester, an acrylic acid, a methacrylic acid, an acrylamide, a methacrylamide, a styrene, a methyl styrene, an epoxide, diacrylate, dimethacrylate, an oligomer of acrylate, an oligomer of methacrylate, and mixtures thereof.

9. The method of embodiment 1, further comprising annealing the nanoparticle deposit before coating the conductive layer with monomers.

10. The method of embodiment 1, further comprising adding an adhesion promoter to the monomers to promote bonding of the polymer film with the porous conductive layer.

11. The method of embodiment 1, further comprising incorporating light transducing particles within the monomer to reduce the total internal reflection of light through the composite film.

12. The method of embodiment 1, further comprising incorporating a light transducing additive in the monomer that absorbs light at one wavelength and re-emits light at a longer wavelength.

13. The method of embodiment 11, wherein the light transducing particles are selected from the group of particles consisting essentially of polymer nanoparticles, polymer microparticles, polymer beads, silica nanoparticles, alumina nanoparticles and metal nanoparticles.

14. The method of embodiment 1, further comprising coating the composite film with a protective layer of a flexible monomer; and curing the monomer coating before removal of the film from the platform.

15. The method of embodiment 1, further comprising applying a transparent polymer film onto the monomer coating before curing the monomers.

16. The method of embodiment 15, wherein the polymer is selected from the group consisting essentially of a polyester, a polyimide, a polymethyl methacrylate, a polyurethane, and a polycarbonate.

17. A method for producing flexible, nanoparticle-polymer composite electrodes, comprising depositing a first plurality of conductive nanoparticles on a smooth surface of a platform; applying a second plurality of conductive nanoparticles on the deposited nanoparticles to form a porous conductive layer; coating the conductive layer with at least one coating of monomers; polymerizing the applied monomers to form a conductive layer-polymer composite film; and removing the composite film from the platform, wherein the surface of the composite film that is removed from the surface of the platform is smooth with surface height variations of 100 nm or less.

18. The method of embodiment 17, wherein the surface of the composite film that is removed from the surface of the platform is smooth with surface height variations ranging between approximately 5 nm and approximately 50 nm.

19. The method of embodiment 17, wherein the first deposit of conductive nanoparticles are selected from the group of conductive nanoparticles consisting essentially of nanowires or nanotubes of polypyrrole, polyaniline, polythiophene, poly(3-methylthiophene), poly(3,4-ethylenedioxythiophene), ceramic conductors, conductive metal oxides, carbon, graphene sheets and metal.

20. The method of embodiment 17, wherein the second deposit of conductive nanoparticles are selected from the group of conductive nanoparticles consisting essentially of nanowires or nanotubes of metal, ceramic conductors, conductive metal oxides, single wall carbon nanotubes, and graphene sheets.

21. The method of embodiment 17, further comprising annealing the nanoparticle deposit before coating the conductive layer with monomers.

22. The method of embodiment 17, wherein the monomer is selected from the group of monomers consisting essentially of an acrylate ester, a methacrylate ester, an acrylic acid, a methacrylic acid, an acrylamide, a methacrylamide, a styrene, a methyl styrene, an epoxide, a diacrylate, a dimethacrylate, an oligomer of acrylate, an oligomer of methacrylate, and mixtures thereof.

23. A method as recited in claim 17, further comprising coating the composite film with a protective layer before removal of the film from the platform.

24. The method of embodiment 17, further comprising applying an additional polymer film over the coating of monomers before the coating is cured.

25. The method of embodiment 17, further comprising depositing a releasing agent on the surface of the platform to facilitate the separation of the composite film from the platform.

26. The method of embodiment 25, wherein the releasing agent is an agent selected from the group of agents consisting essentially of a fluorocarbon; zinc stearate; silicone; and a polysiloxane.

27. The method of embodiment 17, wherein the composite is a rigid solid at room temperature and deformable at temperatures greater than 100° F., wherein the deformation can be locked by lowering the temperature to room temperature.

28. A method for producing flexible, nanoparticle-polymer composite electrodes, comprising applying a releasing agent to a surface of a platform; depositing a plurality of conductive metal nanoparticles on the releasing agent on the surface of the platform to form a porous conductive layer; annealing the conductive layer; coating the conductive layer with at least one coating of monomers and light transducing particles; polymerizing the applied monomers to form a conductive layer-polymer composite film; applying a protective coating to the polymerized composite film; and removing the protected composite film from the platform.

29. The method of embodiment 28, further comprising applying a plurality of a second type of conductive nanoparticles to the first application of nanoparticles to form the porous conductive layer 30. The method of embodiment 29, wherein said conductive layer is formed from a first type of metal nanowires and a second type of metal nanowires applied to the smooth surface of the platform.

31. A composite film electrode having a conductive smooth surface with surface height variations of 100 nm or less.

32. A composite film electrode having a surface that is smooth with surface height variations ranging between approximately 5 nm and approximately 50 nm.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method for producing a flexible nanoparticle-polymer composite electrode, comprising:
   applying a plurality of conductive nanowires consisting essentially of metal to a smooth surface of a platform to form a porous conductive layer;
   coating the conductive layer with at least one coating of monomers;
   curing the monomers in situ to form a conductive layer-polymer composite film, comprising:
      the conductive layer embedded in the composite film, and
      a first surface that is not conductive;
   and
   removing the composite film from the platform, thereby producing the flexible nanoparticle-polymer composite electrode comprising the first surface and a conductive surface, the conductive surface comprising the conductive layer exposed on the conductive surface.

2. A method as recited in claim 1, further comprising:
depositing a releasing agent on the surface of the platform to facilitate the separation of the composite film from the platform.

3. A method as recited in claim 1, further comprising: applying a plurality of a second type of conductive nanoparticles to the nanowires to form the porous conductive layer.

4. A method as recited in claim 1, wherein said nanowires are selected from the group of metal nanowires consisting essentially of silver, copper, aluminum, gold, nickel, and stainless steel.

5. A method as recited in claim 1, wherein said conductive layer is formed from a mixture of the nanowires comprising a first type of metal nanowires and a second type of metal nanowires applied to the smooth surface of the platform.

6. A method as recited in claim 1, wherein said conductive layer is formed from a mixture of the metal nanowires and a conductive particulate selected from the group of particulates consisting essentially of nanowires or nanotubes of polypyrrole, polyaniline, polythiophene, poly(3-methylthiophene), poly(3,4-ethylenedioxythiophene), ceramic conductors, conductive metal oxides, carbon, and graphene sheets.

7. A method as recited in claim 1, wherein said monomers are selected from the group of monomers consisting essentially of an acrylate ester, a methacrylate ester, an acrylic acid, a methacrylic acid, an acrylamide, a methacrylamide, a styrene, a methyl styrene, an epoxide, diacrylate, dimethacrylate, an oligomer of acrylate, an oligomer of methacrylate, and mixtures thereof.

8. A method as recited in claim 1, further comprising:
annealing the nanowires before coating the conductive layer with the monomers.

9. A method as recited in claim 1, further comprising:
adding an adhesion promoter to the monomers to promote bonding of the polymer film with the porous conductive layer.

10. A method as recited in claim 1, further comprising:
incorporating light transducing particles within the monomer to reduce the total internal reflection of light through the composite film.

11. A method as recited in claim 10, wherein said light transducing particles are selected from the group consisting essentially of polymer nanoparticles, polymer microparticles, polymer beads, silica nanoparticles, alumina nanoparticles and metal nanoparticles.

12. A method as recited in claim 1, further comprising:
coating the composite film with a protective layer of a flexible monomer coating; and
curing the flexible monomer coating before removal of the composite film from the platform.

13. A method as recited in claim 1, further comprising applying a transparent polymer film onto the coating of monomers before curing the monomers.

14. A method as recited in claim 13, wherein said polymer is selected from the group consisting essentially of a polyester, a polyimide, a polymethyl methacrylate, a polyurethane, and a polycarbonate.

15. A method as recited in claim 1, wherein a surface of the composite film that is removed from the surface of the platform is smooth with surface height variations less than approximately 50 nm.

16. A method as recited in claim 3, wherein the second type of conductive nanoparticles is selected from the group of conductive nanoparticles consisting essentially of nanowires or nanotubes of metal, ceramic conductors, conductive metal oxides, single wall carbon nanotubes, and graphene sheets.

17. A method as recited in claim 3, further comprising:
annealing the nanowires before coating the conductive layer with the monomers.

18. A method as recited in claim 3, wherein said monomers are selected from the group of monomers consisting essentially of an acrylate ester, a methacrylate ester, an acrylic acid, a methacrylic acid, an acrylamide, a methacrylamide, a styrene, a methyl styrene, an epoxide, a diacrylate, a dimethacrylate, an oligomer of acrylate, an oligomer of methacrylate, and mixtures thereof.

19. A method as recited in claim 3, further comprising:
coating the composite film with a protective layer before removal of the composite film from the platform.

20. A method as recited in claim 3, further comprising:
applying an additional polymer film over the coating of monomers before the coating is cured.

21. A method as recited in claim 2, wherein the releasing agent is an agent selected from the group of agents consisting essentially of a fluorocarbon; zinc stearate; silicone; and a polysiloxane.

22. A method as recited in claim 1, wherein said composite film is a rigid solid at room temperature and deformable at temperatures greater than 100° F., wherein the deformation can be locked by lowering the temperature to room temperature.

23. A method for producing a flexible nanoparticle-polymer composite electrode, comprising:
applying a releasing agent to a surface of a platform;
depositing a plurality of nanowires consisting essentially of metal on the releasing agent on the surface of the platform to form a porous conductive layer;
annealing the conductive layer to enhance conductivity of the conductive layer;
coating the porous conductive layer with at least one coating of monomers and light transducing particles;
polymerizing the applied monomers to form a conductive layer-polymer composite film comprising:
the conductive layer embedded in the composite film, and
a first surface that is not conductive;
applying a protective coating to the polymerized composite film; and
removing the protected composite film from the platform thereby producing the flexible nanoparticle-polymer composite electrode comprising the first surface and a conductive surface, the conductive surface comprising the conductive layer exposed on the conductive surface.

24. A method as recited in claim 23, further comprising: applying a plurality of a second type of conductive nanoparticles to the nanowires to form the porous conductive layer.

25. A method as recited in claim 24, wherein said conductive layer is formed from a first type of the metal nanowires and a second type of the metal nanowires applied to the smooth surface of the platform.

26. The method of claim 1, wherein:
a sheet resistance, conductive smooth surface, transparency, and thickness of the conductive composite film, and dimensions of the nanowires, are such that when the conductive composite film is used as an anode in a polymer Light Emitting Diode (LED) having an active layer thickness of at least 60 nm, an output efficiency (cd/A) of the polymer LED is increased as compared to when the polymer LED uses an ITO anode, and a structure of the conductive composite film is such that the output efficiency, for at least one current density, is unchanged after 10 bending cycles applying 8% compressive strain to the conductive composite film.

27. The method of claim 1, wherein a structure and the conductive smooth surface of the conductive composite film are such that, when the conductive composite film is used as an electrode in a polymer solar cell having an active layer thickness of 40 nm, a current density-voltage characteristic of the polymer solar cell, for at least one voltage, is substantially unchanged after applying 8% linear compressive strain to the conductive composite film.

28. The method of claim 1, wherein the surface of the platform has a surface roughness of 10 nm or less over a 10 micrometer by 10 micrometer area.

29. The method of claim 28, wherein a surface of the composite film that is removed from the surface of the platform is smooth with surface height variations less than 5 nm in a 10 micrometer by 10 micrometer area.

30. The method of claim 1, wherein the platform comprises glass.

31. The method of claim 1, wherein the nanowires are deposited from a dispersion comprising a dispersant.

32. The method of claim 1, further comprising forming a network of the nanowires wherein:
the monomers are selected to penetrate into the network and fill up voids including space unoccupied by the nanowires at an interface with the surface of the platform, and
the composite film has a transmittance of at least 80% at a wavelength between 500 nm and 1000 nm.

33. The method of claim 1, wherein the composite film comprises a polymer film having a thickness of at least 100 micrometers and the conductive layer having a thickness thinner than the polymer film.

34. A method for producing a flexible nanoparticle-polymer composite electrode, comprising:
applying a plurality of conductive nanowires consisting essentially of metal to a smooth surface of a platform to form a porous conductive layer;
coating the conductive layer with at least one coating of monomers;
curing the monomers in situ to form a conductive layer-polymer composite film; and
removing the composite film from the platform, thereby producing the flexible nanoparticle-polymer composite electrode comprising the conductive layer exposed on a conductive surface of the flexible nanoparticle-polymer composite electrode, wherein the composite film comprises a polymer film having a thickness of at least 100 micrometers and the conductive layer having a thickness thinner than the polymer film.

* * * * *